(12) United States Patent
Wong

(10) Patent No.: US 11,512,910 B2
(45) Date of Patent: Nov. 29, 2022

(54) HEAT DISSIPATION DEVICE

(71) Applicant: National Tsing Hua University, Hsinchu (TW)

(72) Inventor: Shwin-Chung Wong, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 17/143,122

(22) Filed: Jan. 6, 2021

(65) Prior Publication Data

US 2022/0128322 A1  Apr. 28, 2022

(30) Foreign Application Priority Data

Oct. 28, 2020  (TW) .................................. 109137403

(51) Int. Cl.
  *F28F 7/00* (2006.01)
  *F28F 3/04* (2006.01)
  *H05K 7/20* (2006.01)

(52) U.S. Cl.
  CPC .......... *F28F 3/048* (2013.01); *F28F 2215/10* (2013.01); *H05K 7/20409* (2013.01)

(58) Field of Classification Search
  USPC ................................................. 165/80.3, 185
  See application file for complete search history.

(56) References Cited

U.S. PATENT DOCUMENTS

| 3,476,179 | A | * | 11/1969 | Meister et al. | ......... | F28F 3/048 |
| | | | | | | 165/DIG. 392 |
| 5,042,257 | A | * | 8/1991 | Kendrick | ................ | F25B 21/02 |
| | | | | | | 62/3.1 |
| 5,553,377 | A | * | 9/1996 | Hirano | ..................... | F28F 1/022 |
| | | | | | | 29/890.053 |
| 5,947,365 | A | * | 9/1999 | Tanaka | ................... | B21K 25/00 |
| | | | | | | 228/183 |
| 6,145,585 | A | * | 11/2000 | Wei | .......................... | H02K 5/18 |
| | | | | | | 165/80.2 |

(Continued)

FOREIGN PATENT DOCUMENTS

| CN | 102348366 | * | 2/2012 |
| CN | 102829664 | | 12/2012 |

(Continued)

OTHER PUBLICATIONS

"Office Action of Taiwan Counterpart Application", dated Jul. 12, 2021, p. 1-p. 7.

*Primary Examiner* — Claire E Rojohn, III
(74) *Attorney, Agent, or Firm* — JCIPRNET

(57) ABSTRACT

A heat dissipation device includes a base, fins and strip-shaped plates. The fins protrude side by side from the base, and the fins respectively include first end edges and second end edges opposite to each other. The first end edges are connected to the base. The strip-shaped plates are parallel to the base and connected to at least a part of the second end edges of the fins, and strip-shaped openings are formed between the strip-shaped plates. The base, the fins and the strip-shaped plates collectively surround chambers in a non-closed manner, and each of the strip-shaped openings is connected to the corresponding chamber. A distance between two adjacent fins of the fins is S, a width of any one of the strip-shaped openings is d, and d/S is between 0.01 and 0.4.

10 Claims, 12 Drawing Sheets

(56) References Cited

U.S. PATENT DOCUMENTS

| | | | | |
|---|---|---|---|---|
| 6,201,699 B1* | 3/2001 | Ayres | ............... | H01L 23/4093 |
| | | | | 174/16.3 |
| 2005/0274490 A1 | 12/2005 | Larson | | |
| 2012/0217630 A1* | 8/2012 | Kodani | ............... | F28F 3/048 |
| | | | | 257/E23.101 |
| 2014/0116651 A1* | 5/2014 | Tong | ............... | H01F 27/08 |
| | | | | 165/104.19 |
| 2020/0300560 A1* | 9/2020 | Shioya | ............... | F28F 3/06 |
| 2020/0400387 A1* | 12/2020 | Schultz | ............... | B23K 1/0016 |
| 2021/0333055 A1* | 10/2021 | Colson | ............... | F28F 3/048 |
| 2022/0069672 A1* | 3/2022 | Zierer | ............... | H02K 1/20 |

FOREIGN PATENT DOCUMENTS

| | | |
|---|---|---|
| CN | 205030024 | 2/2016 |
| CN | 208029293 | 10/2018 |
| CN | 208590514 | 3/2019 |
| TW | 383881 | 3/2000 |
| TW | 201221892 | 6/2012 |
| WO | 2018198356 | 11/2018 |

\* cited by examiner

HEAT DISSIPATION DEVICE

CROSS-REFERENCE TO RELATED APPLICATION

This application claims the priority benefit of Taiwan application serial no. 109137403, filed on Oct. 28, 2020. The entirety of the above-mentioned patent application is hereby incorporated by reference herein and made a part of this specification.

BACKGROUND

Technical Field

The disclosure relates to a heat dissipation device, and more particularly, to a heat dissipation device with better heat dissipation efficiency.

Description of Related Art

At present, some heat dissipation devices use natural convection supplemented by the heat radiation to dissipate the heat. However, due to the weak heat dissipation capacity of natural convection, large-area fins are often required to enhance the heat dissipation. If such devices are restricted by the size and the surface area, the size of the fins will be difficult to expand, and the heat dissipation capacity will be correspondingly limited. Therefore, how to improve the heat dissipation efficiency is the main issue for research in this field.

SUMMARY

The disclosure provides a heat dissipation device with a better heat dissipation effect.

The heat dissipation device of the disclosure includes a base, a plurality of fins, and a plurality of strip-shaped plates. The fins protrude side by side from the base. The fins respectively include a plurality of first end edges and a plurality of second end edges opposite to each other, and the first end edges are connected to the base. The strip-shaped plates are parallel to the base and connected to at least a part of the second end edges of the fins, and a plurality of strip-shaped openings are formed between the strip-shaped plates. The base, the fins, and the strip-shaped plates collectively surround a plurality of chambers in a non-closed manner, and each of the strip-shaped openings are connected to the corresponding chambers. A distance between the two adjacent fins of the fins is S, a width of any one of the strip-shaped openings is d, and d/S is between 0.01 and 0.4.

In an embodiment of the disclosure, the d/S is between 0.1 and 0.35.

In an embodiment of the disclosure, the number of the strip-shaped plates is equal to the number of the fins, and the strip-shaped plates are respectively connected to the second end edges of the fins.

In an embodiment of the disclosure, the strip-shaped plates include two outer plates located at the outermost sides and a plurality of inner plates located between the two outer plates, and widths of the inner plates are the same.

In an embodiment of the disclosure, the strip-shaped plates include a plurality of first type plates and a plurality of second type plates. The width of each of the first type plates is different from the width of each of the second type plates, and the first type plates and the second type plates are alternately disposed.

In an embodiment of the disclosure, the number of the strip-shaped plates is less than the number of the fins. The fins include a plurality of first fins and a plurality of second fins that are alternately disposed, and the strip-shaped plates are respectively connected to the first fins and not connected to the second fins.

In an embodiment of the disclosure, the second fins have round corners or lead angles at the end edges away from the base.

In an embodiment of the disclosure, the strip-shaped plates have round corners or lead angles.

In an embodiment of the disclosure, the strip-shaped openings correspond to a plurality of center lines of the chambers.

In an embodiment of the disclosure, the strip-shaped openings are staggered to the center lines of the chambers.

In an embodiment of the disclosure, two adjacent strip-shaped openings are grouped into various groups, and the two strip-shaped openings in each group are close to each other.

In an embodiment of the disclosure, the strip-shaped plates have various thicknesses.

In summary, the heat dissipation device of the disclosure connects the strip-shaped plates parallel to the base to at least part of the second end edges of the fins, so that the base, the fins and the strip-shaped plates collectively surround the chambers in a non-closed manner, and the strip-shaped openings formed between the strip-shaped plates are connected to the chambers. The distance between the two adjacent fins of the fins is S, the width of any one of the strip-shaped openings is d, and the d/S is between 0.01 and 0.4. Through a simulation, when the d/S is in the above range, the heat dissipation device has a better heat dissipation performance.

Figure 1A:
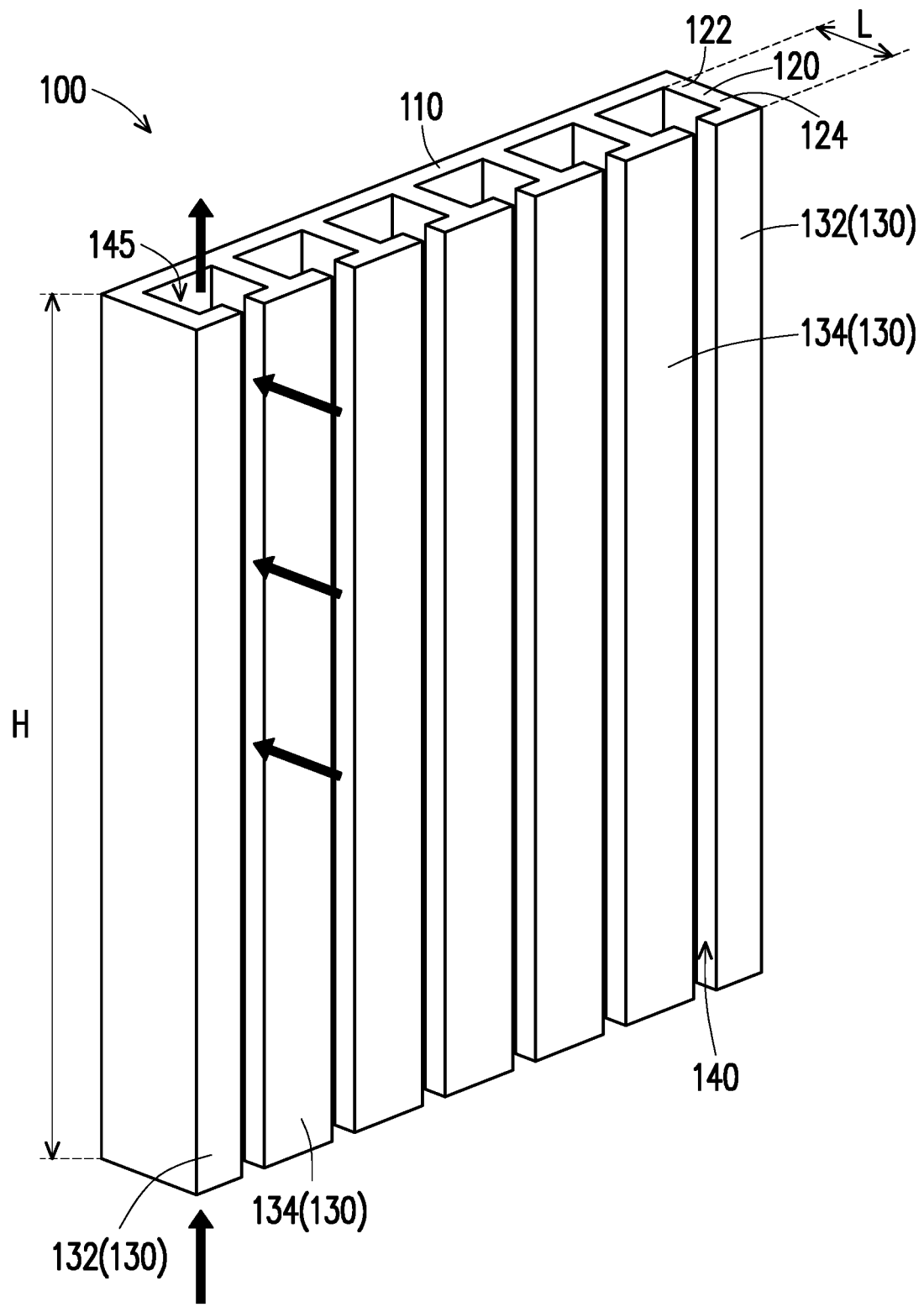
FIG. 1A is a schematic perspective view of a heat dissipation device according to an embodiment of the disclosure.
Figure 3A:
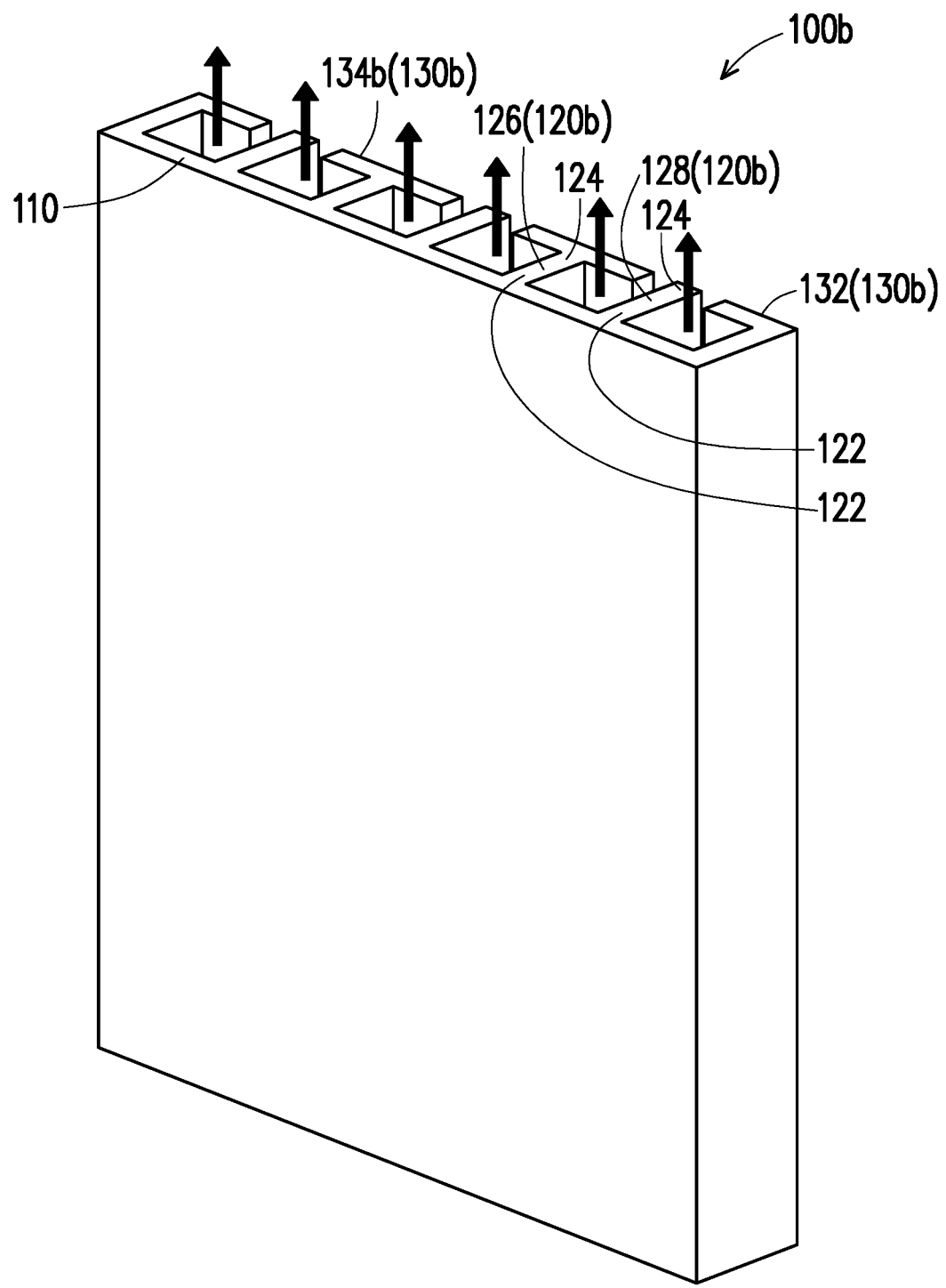
FIG. 3A is a schematic perspective view of a heat dissipation device according to another embodiment of the disclosure.

FIC. 3C is a graph showing a relation between d/S and the heat dissipation in the heat dissipation devices of FIGS. 1A and 3A.

FIGS. 4 to 8 are schematic top views of various heat dissipation devices according to other embodiments of the disclosure.

Figure 8:
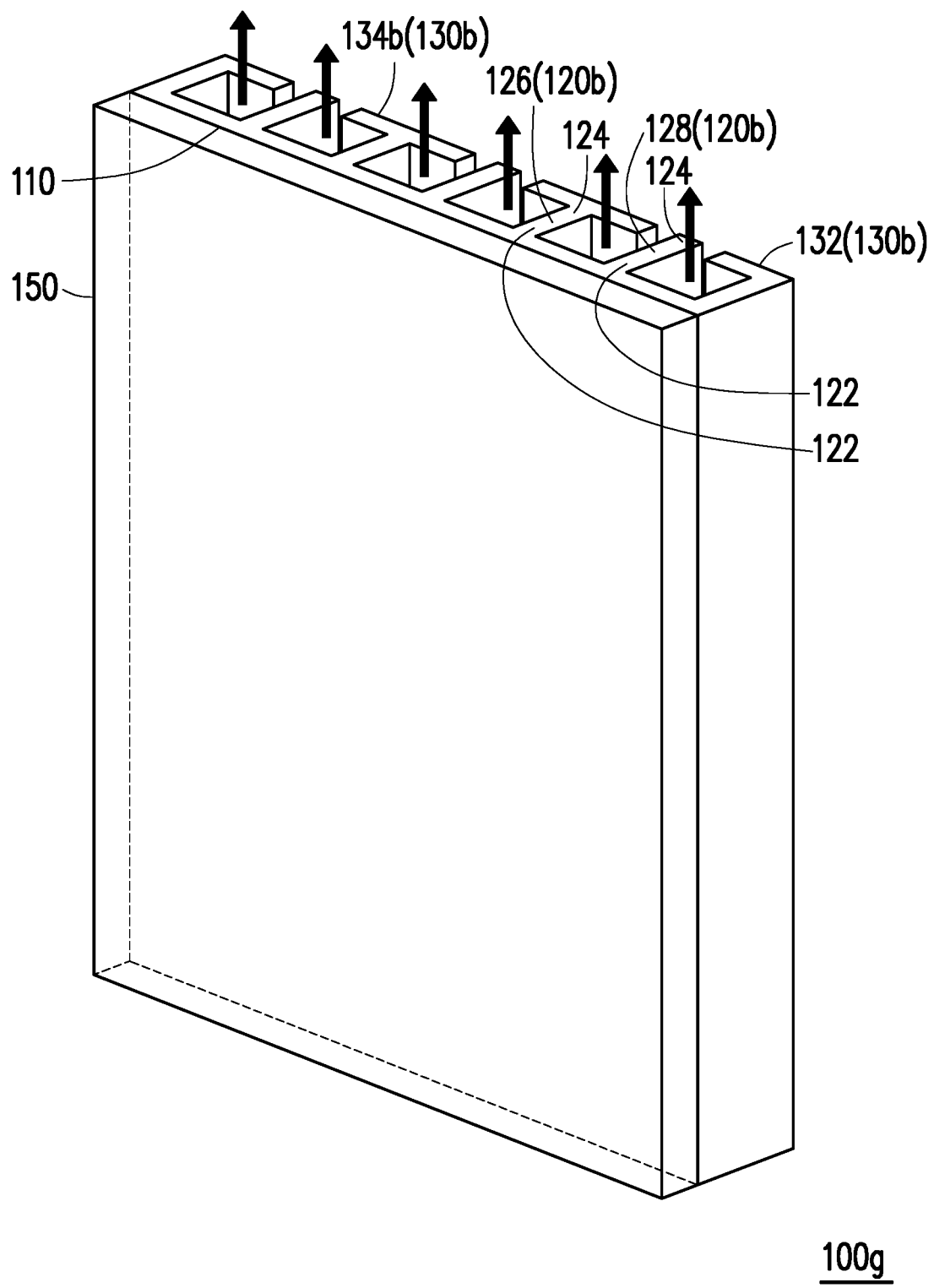
Figure 9:
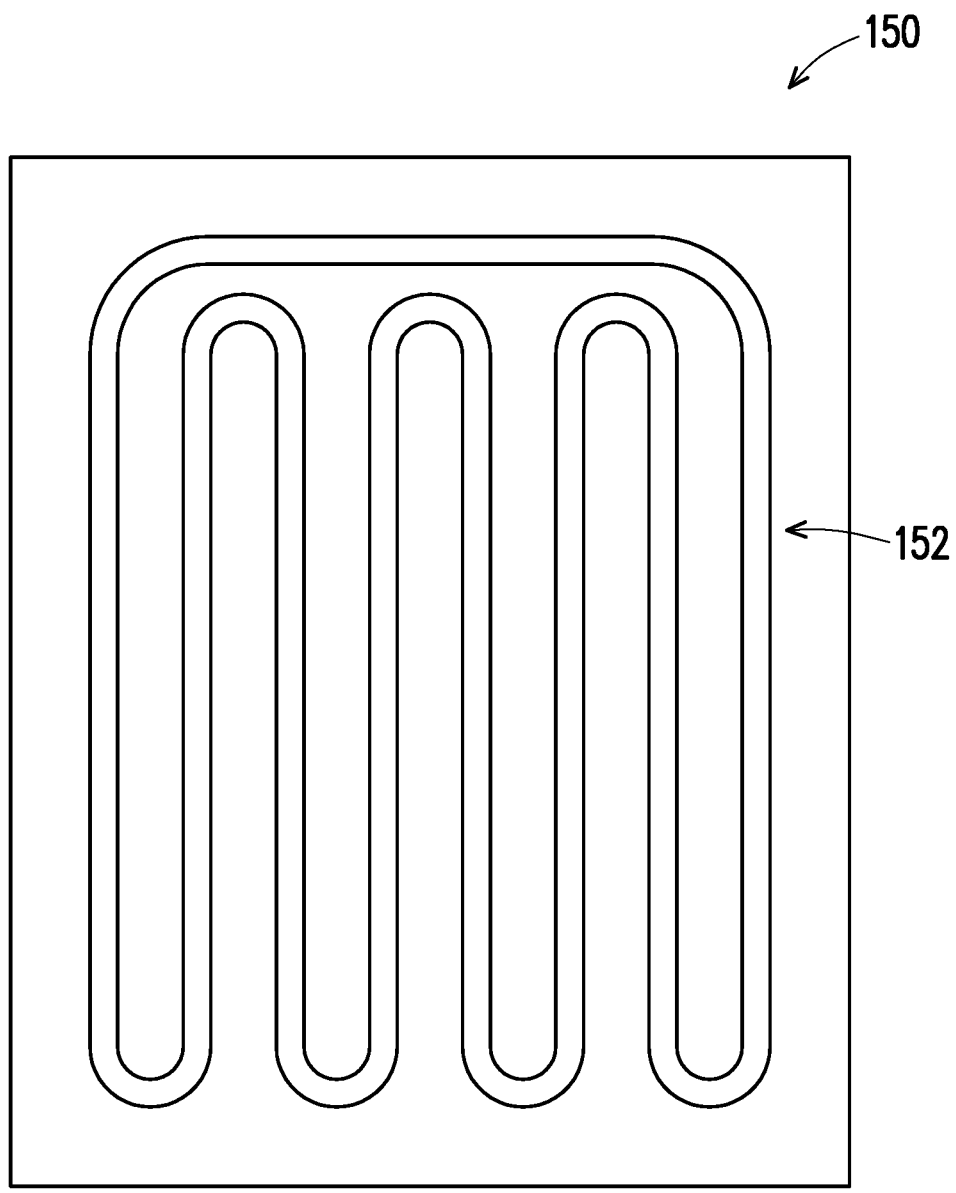

FIG. 9 is an internal schematic view of a heat plate of the heat dissipation device of FIG. 8.

DETAILED DESCRIPTION OF DISCLOSED EMBODIMENTS

Figure 1B:
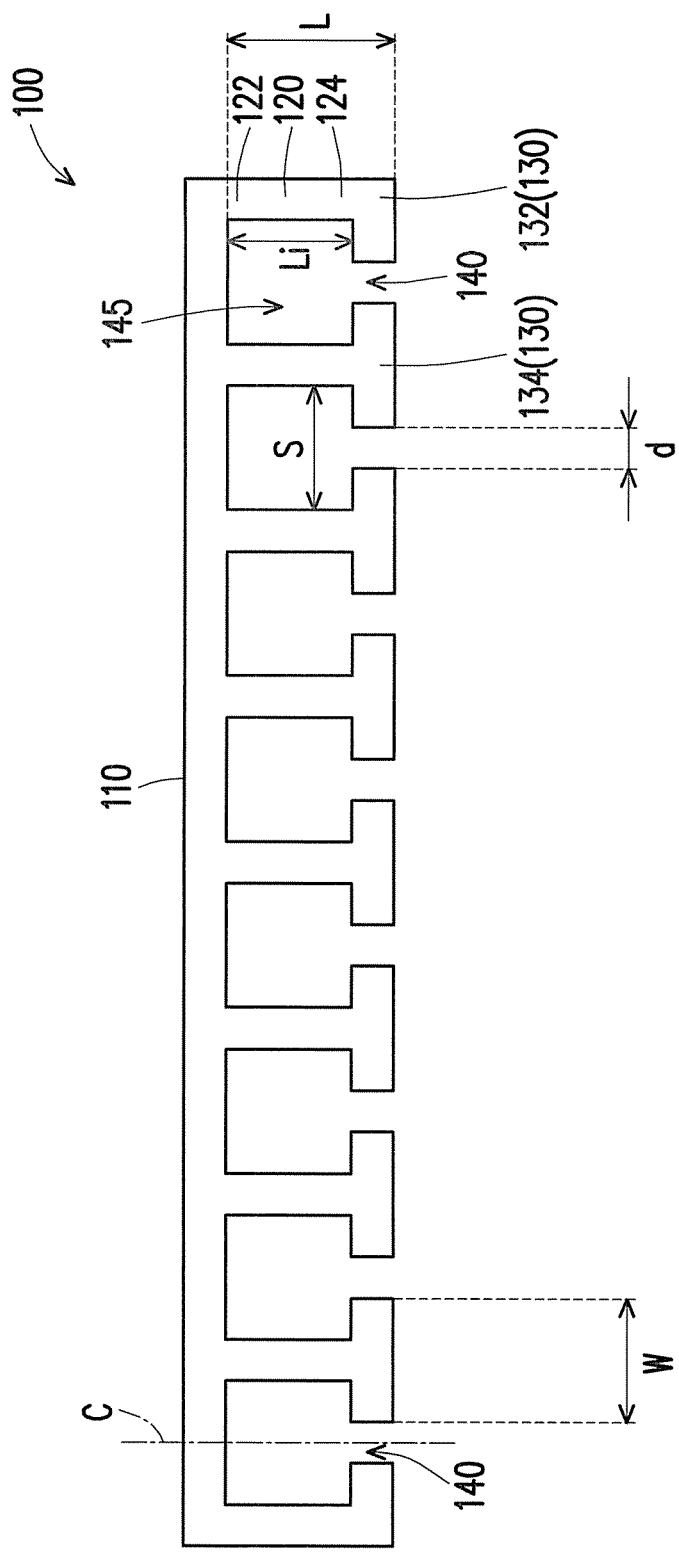
FIG. 1B is a schematic top view of the heat dissipation device of FIG. 1A.

FIG. 1A is a schematic perspective view of a heat dissipation device according to an embodiment of the disclosure. FIG. 1B is a schematic top view of the heat dissipation device of FIG. 1A. Referring to FIGS. 1A and 1B. A heat dissipation device 100 of this embodiment may be used as a part of the casing of an electronic device such as fanless electronic devices (such as 5G base stations, fanless industrial computers, fanless gaming computers, or other forms of fanless computers, etc.), and provides support, protection, and the heat dissipation simultaneously. Of course, the heat dissipation device 100 of this embodiment may also be used solely for the heat dissipation, and electronic equipment and functions that the heat dissipation device 100 applies to are not limited thereto.

In this embodiment, the heat dissipation device 100 includes a base 110, a plurality of fins 120, and a plurality of strip-shaped plates 130. The base 110 may contact a heat source (not shown). The fins 120 protrude side by side from the base 110, and the fins 120 respectively include a plurality of first end edges 122 and a plurality of second end edges 124 opposite to each other. The first end edges 122 are connected to the base 110.

The strip-shaped plates 130 are parallel to the base 110 and connected to at least a part of the second end edges 124 of the fins 120. In this embodiment, the number of the strip-shaped plates 130 is equal to the number of the fins 120, and the strip-shaped plates 130 are respectively connected to the second end edges 124 of the fins 120. Of course, in other embodiments, it may be that only part of the fins 120 are connected to the strip-shaped plates 130. The first end edges 122 can be thicker than second end edges 124, and the base 110 can be thicker than the fins 120. Also, the strip-shaped plates 130 can be uneven in thickness, with the ends thinner than the part in connection with the second end edges 124 of the fins 120.

In addition, in this embodiment, the strip-shaped plates 130 include two outer plates 132 located at the outermost sides and a plurality of inner plates 134 located between the two outer plates 132. It is clearly seen from FIG. 1B that, in this embodiment, widths W of the inner plates 134 are the same. Of course, in other embodiments, the widths of the inner plates 134 may also be different.

In this embodiment, the base 110, the fin 120, and the strip-shaped plate 130 may be integrated, and may be made by the technology of aluminum extrusion, and therefore have an advantage of low costs. Of course, shapes, materials, and molding methods of the base 110, the fin 120, and the strip plate 130 are not limited thereto.

As shown in FIG. 1B, a plurality of strip-shaped openings 140 are formed between the strip-shaped plates 130. The base 110, the fins 120, and the strip-shaped plates 130 collectively surround a plurality of chambers 145 in a non-closed manner, and each of the strip-shaped openings 140 is connected to a corresponding chamber 145. In this embodiment, the strip-shaped openings 140 correspond to a plurality of center lines C of the chambers 145, but positions of the strip-shaped openings 140 are not limited thereto.

It should be noted that a first type of conventional heat sink is composed of a bottom plate and a plurality of fins. For this type of heat sink, since the fins are completely open on the side far away from a plurality of ends of the bottom plate, part of the cold air is easily introduced through gaps between the ends of the fins far away from the bottom plate. In this situation, the chimney effect can be hardly utilized to help take the heat away from the heat sink along an extending direction of the fins. In addition, a second type of conventional heat sink is composed of two parallel bottom plates and a plurality of fins located between the two bottom plates. This type of heat sink has a plurality of closed channels. Although the chimney effect can help enhance the upward airflow and carry heat away from the heat sink, the airflow resistance in the closed channels is high, and the air in the upper half of the closed channels gets hotter so that heat dissipation decreases when hot air rises along the closed channels.

Compared with the first type of conventional heat sink, the heat dissipation device 100 of this embodiment has the strip-shaped plate 130 located at the second end edge 124 of the fin 120, so that the chamber 145 is not completely opened on a side of the second end edge 124 of the fin 120 (the lower side of FIG. 1B), and the cold air is not excessively introduced into the chamber 145, which may make better use of the chimney effect to enhance the upward airflow and take more heat away from the heat dissipation device 100.

Compared with the second type of conventional heat sink, the heat dissipation device 100 of this embodiment has the strip-shaped openings 140 between the strip-shaped plates 130. In addition to reducing the airflow resistance in the chamber 145, the cold air may be slightly introduced on the side of the second end edge 124 (the lower side of FIG. 1B), so that the degree of temperature accumulation of the airflow in the chamber 145 is slowed down when the airflow rises along an extending direction of the fin 120 in FIG. 1A, which may effectively prevent the upper half of the chamber 145 from being overheated and affecting the heat dissipation effect.

Therefore, under the premise that the airflow resistance is moderate, the heat dissipation device 100 of this embodiment may preferably use the chimney effect to provide greater buoyancy for the air in the chamber 145, so that the rising air in the chamber 145 may take more heat away from the heat dissipation device 100.

Figure 2:
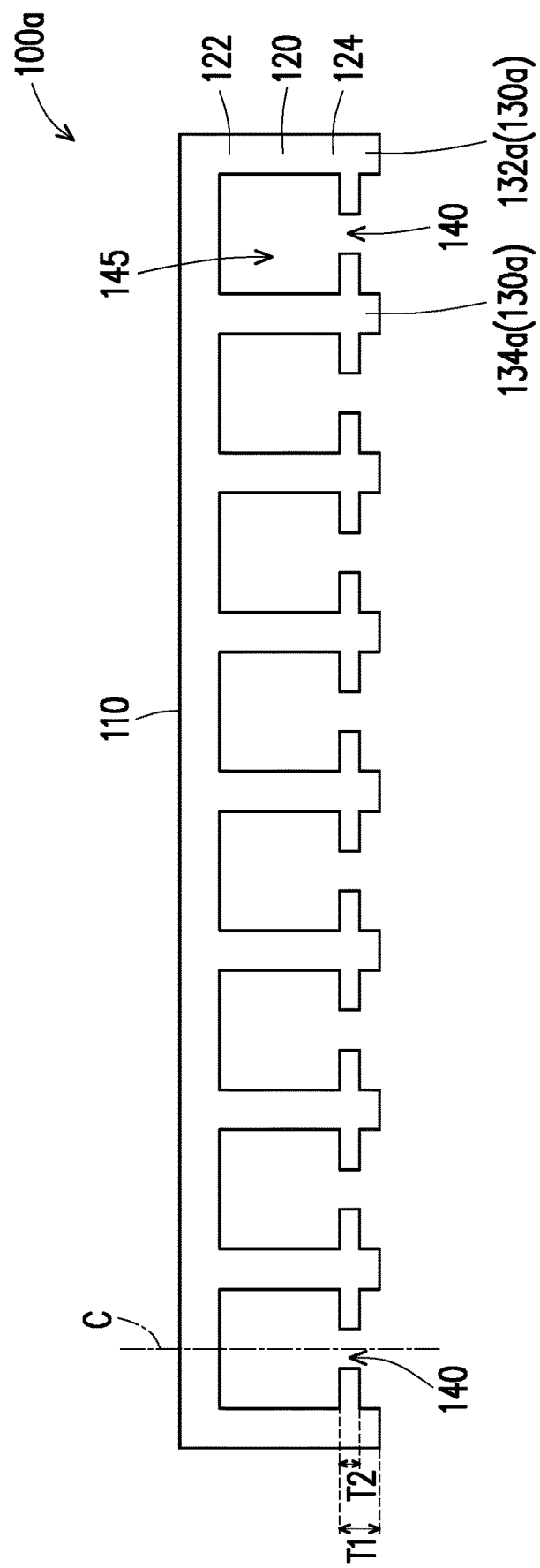
FIG. 2 is a schematic top view of a heat dissipation device according to another embodiment of the disclosure.

FIG. 2 is a schematic top view of a heat dissipation device according to another embodiment of the disclosure. Referring to FIG. 2, the main difference between a heat dissipation device 100a of this embodiment and the heat dissipation device 100 of FIG. 1B is that each of the strip plates 130 of the heat dissipation device 100 in FIG. 1B is evenly thick. In this embodiment, an outer plate 132a of a strip-shaped plate 130a has various thicknesses T1 and T2, and an inner plate 134a has various thicknesses T1 and T2. Such a design may expand the total heat dissipation area of the strip-shaped plate 130a, and may reduce the weight and material costs of the strip-shaped plate 130a.

Of course, in other embodiments, the strip-shaped plate 130a of the heat dissipation device 100a may also be partially evenly thick and partially unevenly thick. In addition, a shape of the strip-shaped plate 130a which is unevenly thick is not limited by the drawings. From the top view, an edge contour of the strip-shaped plate 130a may also be triangular, curved, wavy, or irregular.

Figure 3B:
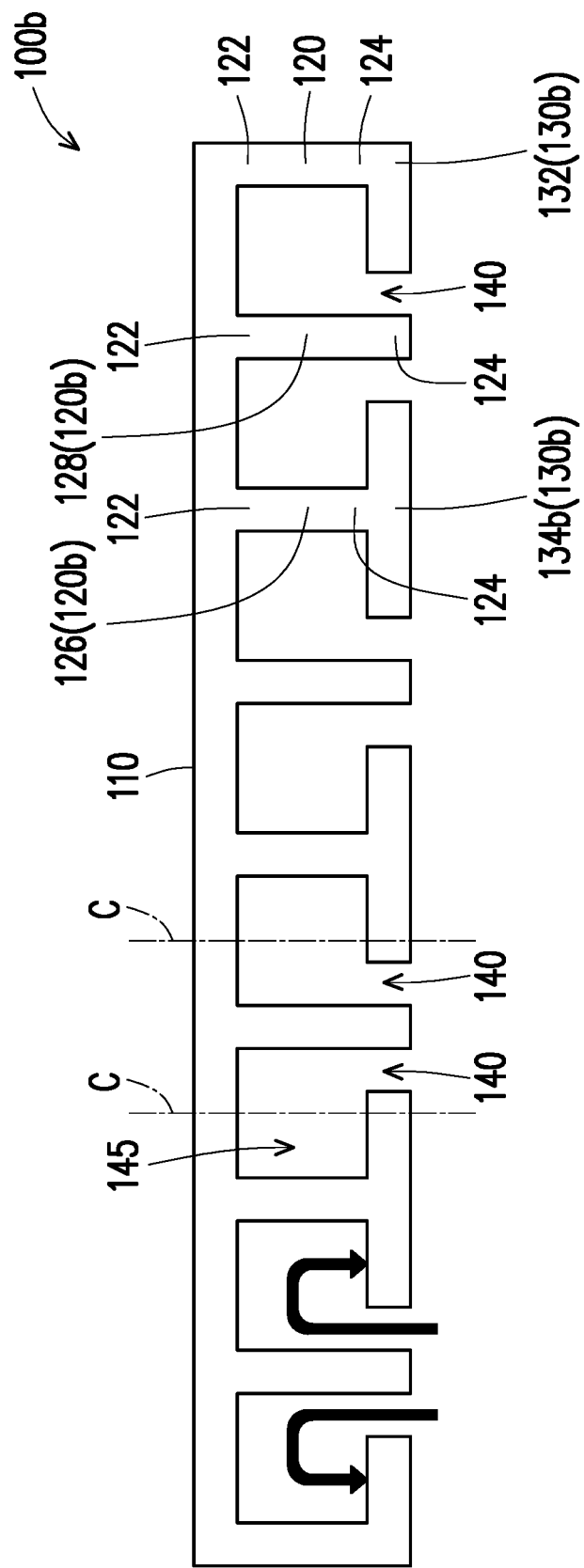
FIG. 3B is a schematic top view of the heat dissipation device of FIG. 3A.

FIG. 3A is a schematic perspective view of a heat dissipation device according to another embodiment of the disclosure. FIG. 3B is a schematic top view of the heat dissipation device of FIG. 3A. Referring to FIGS. 3A and 3B, the main difference between a heat dissipation device 100b of this embodiment and the heat dissipation device 100 of FIG. 1B is that the strip-shaped openings 140 in FIG. 1B correspond to the center lines C of the chambers 145. In this embodiment, the strip-shaped openings 140 are staggered to the center lines C of the chambers 145.

Specifically, in this embodiment, two adjacent strip-shaped openings of the strip-shaped openings 140 are grouped into various groups, and the two strip-shaped openings 140 in each group are close to each other. Such a design forms a paired swirl flow that is similar to a mirrored shape. The paired swirl flow rises along an extending direction of a fin 120b, and such periodic paired upward rising swirl flow may enhance heat dissipation of natural convection.

In addition, in this embodiment, the number of the strip-shaped plates 130b is less than the number of the fins 120b. The fins 120b include a plurality of first fins 126 and a plurality of second fins 128 that are alternately disposed. The strip-shaped plates 130b are respectively connected to the first fins 126 and not connected to the second fins 128. In this way, the strip-shaped opening 140 staggered to the center line C of the chamber 145 is formed.

Figure 3C:
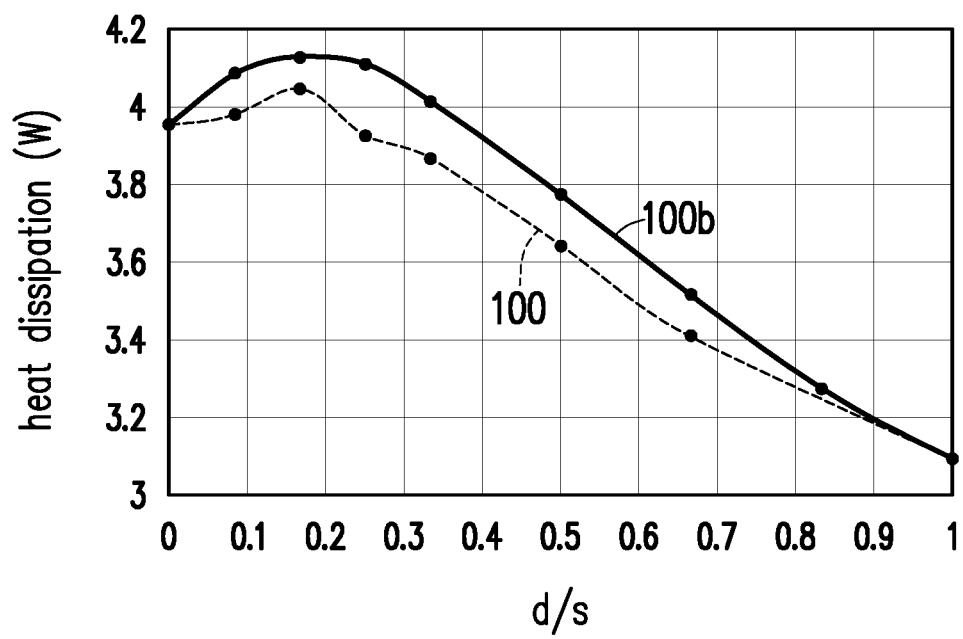

It is worth mentioning that, in this embodiment, the distance between the two adjacent fins of the fins 120 is S (marked in FIG. 1B), and the width of any one of the strip-shaped openings 140 is d (marked in FIG. 1B). FIC. 3C is a graph showing a relation between d/S and the heat dissipation in the heat dissipation devices of FIGS. 1A and 3A. Referring to FIG. 3C, FIG. 3C is a simulation for the heat dissipation device 100 of FIG. 1A and the heat dissipation device 100b of FIG. 3A. A height H of the heat dissipation device 100 and the heat dissipation device 100b (FIG. 1A) is 250 millimeters (mm), a total length L of the fin 120 and the strip-shaped plate in a longitudinal direction (FIG. 1A) is 16 mm, a length Li of the fin 120 (marked in FIG. 1B) is 15 mm, and a distance S (marked in FIG. 1B) is 12 mm. Of course, the size of the heat dissipation device 100 is not limited thereto.

Through the simulation, the single-channel d/S between 0.01 and 0.4 achieves a good heat dissipation effect when the temperature difference between the heat dissipation device and the ambient air is 55 K. In an improved exemplary embodiment, the d/S is between 0.1 and 0.35. For example, when d/S=0.20, the heat dissipation is 4.5% higher than the second conventional heat sink, and is even 34% higher than the first conventional heat sink.

Figure 4:
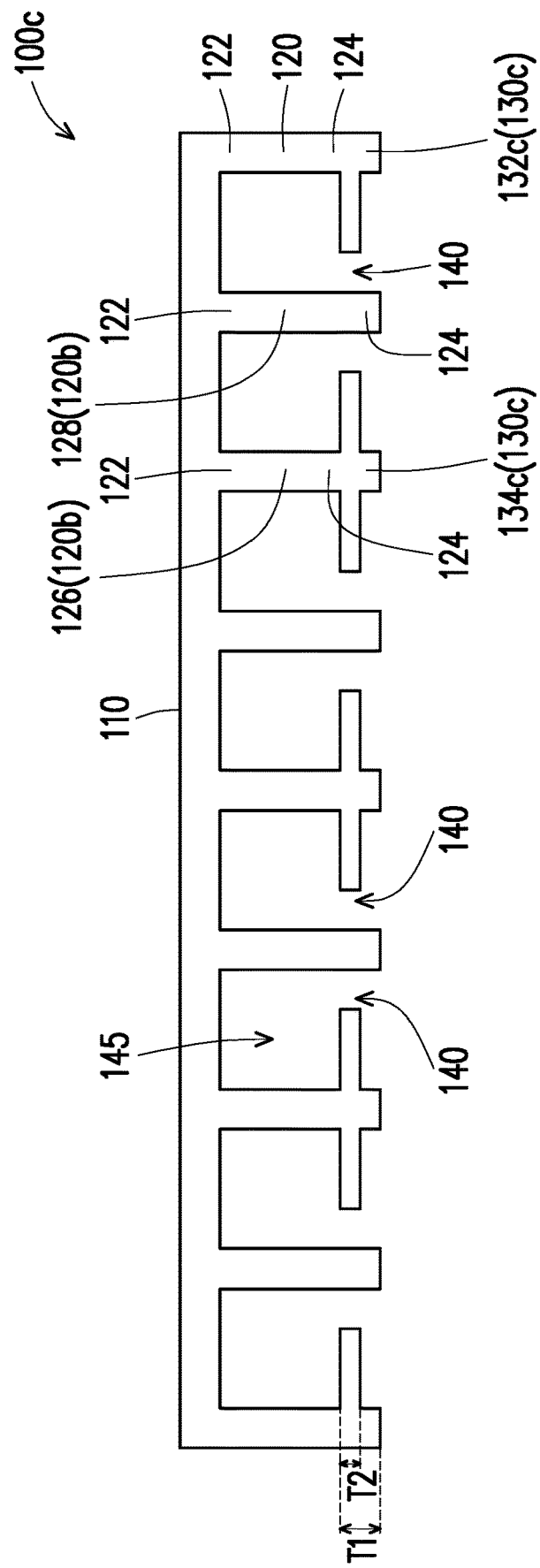

FIGS. 4 to 8 are schematic top views of various heat dissipation devices according to other embodiments of the disclosure. Referring to FIG. 4 first, the main difference between a heat dissipation device 100c of this embodiment and the heat dissipation device 100b of FIG. 3 is that, in FIG. 3, an outer plate 132 of the strip-shaped plate 130 of the heat dissipation device 100b is evenly thick, and an inner plate 134b is evenly thick.

In this embodiment, an outer plate 132c of a strip-shaped plate 130c has various thicknesses T1 and T2, and an inner plate 134c has various thicknesses T1 and T2. Such a design may expand a total heat dissipation area of the strip-shaped plate 130c, and may reduce the weight and material costs of the strip-shaped plate 130c.

Of course, in other embodiments, the strip-shaped plate 130c of the heat dissipation device 100c may also be partially evenly thick and partially unevenly thick. In addition, the shape of the strip-shaped plate 130c which is unevenly thick is not limited by the drawings. From the top view, an edge contour of the strip-shaped plate 130c may also be triangular, curved, wavy, or irregular.

Figure 5:
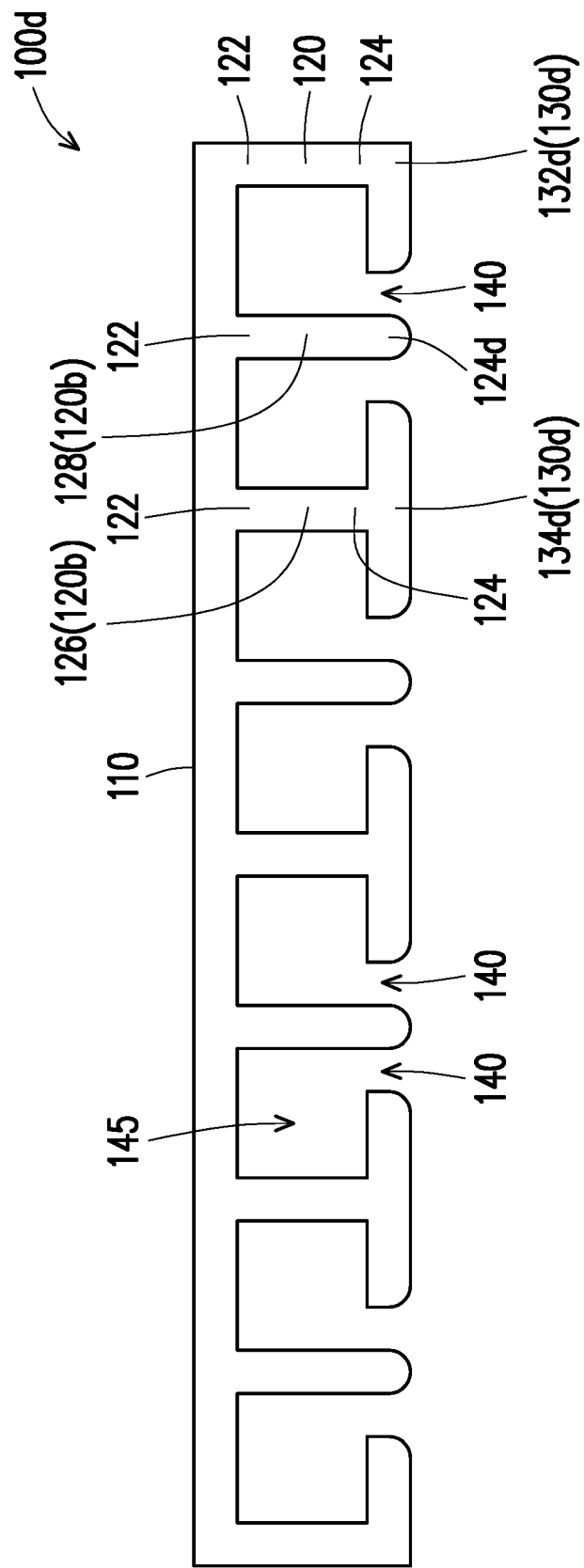

Referring to FIG. 5, the main difference between a heat dissipation device 100d of this embodiment and the heat dissipation device 100b of FIG. 3 is that, in this embodiment, an outer plate 132d and an inner plate 134d of a strip-shaped plate 130d respectively have a round corner or a lead angle, or/and the second fin 128 has a round corner or a lead angle at a second end edge 124d away from the base. Such a design may reduce the resistance of the cold air entering the chamber 145 from the outside through the strip-shaped opening 140.

Figure 6:
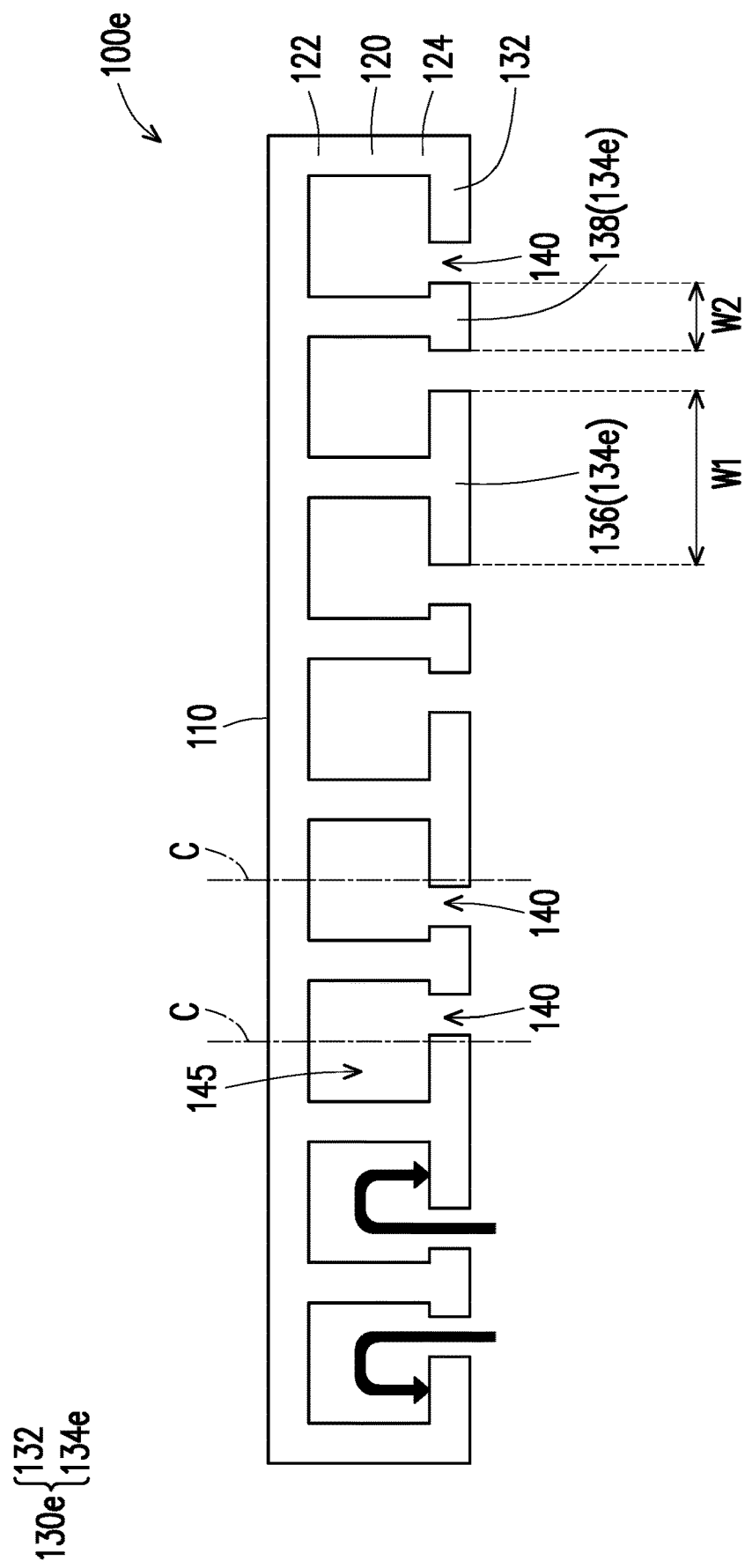

Referring to FIG. 6, the main difference between a heat dissipation device 100e of this embodiment and the heat dissipation device 100b of FIG. 3 is that, in this embodiment, the number of a strip-shaped plates 130e is equal to the number of the fins 120. The strip-shaped plates 130e include a plurality of inner plates 134e. The inner plates 134e include a plurality of first type plates 136 and a plurality of second type plates 138. A width W1 of each of the first type plates 136 is different from a width W2 of each of the second type plates 138, and the first type plates 136 and the second type plates 138 are alternately disposed.

Similarly, in this embodiment, the strip-shaped openings 140 are staggered to the center lines C of the chambers 145. The two adjacent strip-shaped openings of the strip-shaped openings 140 are grouped into various groups, and the two strip-shaped openings 140 in each group are close to each other, which forms the paired swirl flow that is similar to a mirrored shape and rises to have the better natural convection effect.

Figure 7:
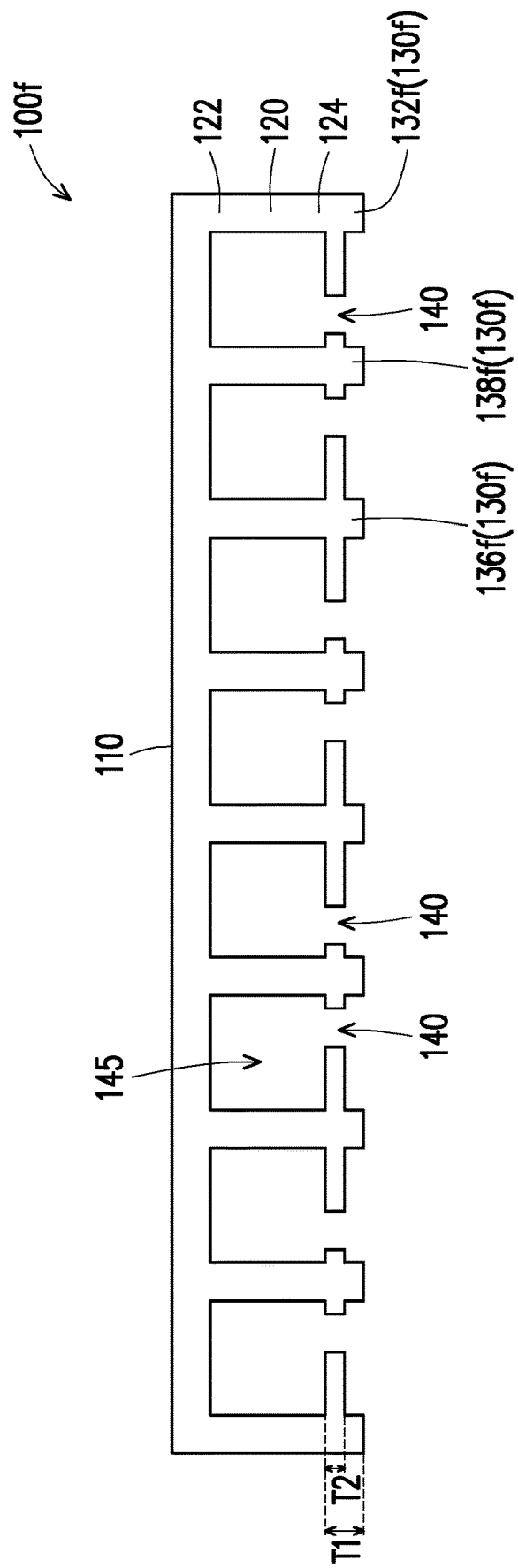

Referring to FIG. 7, the main difference between a heat dissipation device 100f of this embodiment and the heat dissipation device 100e of FIG. 6 is that, in FIG. 6, the outer plate 132 of the heat dissipation device 100e and each of the first type plates 136 and the second type plates 138 are evenly thick.

In the embodiment, each of a strip-shaped plates 130f is unevenly thick. Specifically, each of first type plates 136f and second type plates 138f of outer plates 132f and inner plates 134f has various thicknesses T1 and T2. Such a design may expand a total heat dissipation area of the strip-shaped plate 130f, and may reduce the weight and material costs of the strip-shaped plate 130f.

Of course, in other embodiments, the strip-shaped plate 130f of the heat dissipation device 100f may also be partially evenly thick and partially unevenly thick. In addition, the shape of the strip-shaped plate 130f which is unevenly thick is not limited by the drawings. From the top view, an edge contour of the strip-shaped plate 130f may also be triangular, curved, wavy, or irregular.

FIG. 9 is an internal schematic view of a heat plate of the heat dissipation device of FIG. 8. Referring to FIGS. 8 and 9, the main difference between a heat dissipation device 100g of this embodiment and the heat dissipation device 100b of FIG. 3 is that, in this embodiment, the heat dissipation device 100g further includes a heat plate 150, which is embedded with a pulsating heat pipe or heat pipes or it can be a vapor chamber and is used to contact a heat source (not shown) as a heat spreader. The heat plate 150 is disposed beside the base 110 to thermally contact the base 110, and the heat dissipation efficiency are further improved.

In this embodiment, the heat plate 150 may be a metal flat plate, and the inside may have a loop 152 as shown in FIG. 9. The loop 152 shown in FIG. 9 may be used as a loop of an oscillating heat pipe after the heat plate 150 is hermetically connected with the base plate 110 of the heat dissipation device 100. After vacuuming, an appropriate amount of working fluid is injected into the loop 152 and degassed, and an oscillating heat pipe with a high temperature uniformity effect is formed.

In an embodiment, the loop 152 shown in FIG. 9 is also formed on the base 110. In this way, the heat dissipation device may not require an additional heat plate 150. In other embodiments, a heat pipe array may be embedded in the heat plate 150, and the heat plate 150 may also be replaced by a vapor chamber, which also has a good temperature uniformity effect.

In summary, the heat dissipation device of the disclosure connects the strip-shaped plates parallel to the base to at least part of the second end edges of the fins, so that the base, the fins and the strip-shaped plates collectively surround the chambers in a non-closed manner, and the strip-shaped openings formed between the strip-shaped plates are connected to the chambers. The distance between the two adjacent fins of the fins is S, the width of any one of the strip-shaped openings is d, and the d/S is between 0.01 and 0.4. Through the simulation, when the d/S is in the above range, the heat dissipation device has the better heat dissipation performance.

What is claimed is:

1. A heat dissipation device, comprising:
   a base;
   a plurality of fins protruding side by side from the base, and the fins respectively comprising a plurality of first end edges and a plurality of second end edges opposite to each other, wherein the first end edges are connected to the base; and
   a plurality of strip-shaped plates parallel to the base and connected to at least a part of the second end edges of the fins, a plurality of strip-shaped openings formed between the strip-shaped plates, and the base, the fins, and the strip-shaped plates collectively surrounding a plurality of chambers in a non-closed manner, wherein each of the strip-shaped openings is connected to the corresponding chamber, and is offset from a center line of the corresponding chamber which is perpendicular to the base, all the fins directly contact to the base, two adjacent strip-shaped openings of the strip-shaped openings and a part of the fins are grouped into various groups, the part of fins in each group comprises a middle fin and two adjacent fins, the middle fin is located between the two adjacent strip-shaped openings, and two adjacent fins are disposed at two sides of the middle fin and adjacent to the middle fin, a distance between a projection of each one of the two adjacent strip-shaped openings in the group projected to the base and a projection of the middle fin projected to the base is shorter than a distance between the projection of the strip-shaped opening in the group projected to the base and a projection of one of two adjacent fins adjacent to the strip-shaped opening in the group projected to the base, and in any two adjacent strip-shaped plates of the strip-shaped plates, a projection of one of the two adjacent strip-shaped plates projected to the base does not overlap with a projection of an other one of the two adjacent strip-shaped plates projected to the base, wherein
   a distance between two adjacent fins of the fins is S, a width of any one of the strip-shaped openings is d, and d/S is between 0.01 and 0.4.

2. The heat dissipation device according to claim 1, wherein the d/S is between 0.1 and 0.35.

3. The heat dissipation device according to claim 1, wherein the number of the strip-shaped plates is equal to the number of the fins, and the strip-shaped plates are respectively connected to the second end edges of the fins.

4. The heat dissipation device according to claim 3, wherein the strip-shaped plates comprise two outer plates located at outermost sides and a plurality of inner plates located between the two outer plates, and widths of the inner plates are the same.

5. The heat dissipation device according to claim 3, wherein the strip-shaped plates comprise a plurality of first type plates and a plurality of second type plates, a width of each of the first type plates is different from a width of each of the second type plates, and the first type plates and the second type plates are alternately disposed.

6. The heat dissipation device according to claim 1, wherein the number of the strip-shaped plates is less than the number of the fins, the fins comprise a plurality of first fins and a plurality of second fins that are alternately disposed, and the strip-shaped plates are respectively connected to the first fins and not connected to the second fins.

7. The heat dissipation device according to claim 6, wherein the second fins have round corners or lead angles at the end edges away from the base.

8. The heat dissipation device according to claim 1, wherein the strip-shaped plates have round corners or lead angles.

9. The heat dissipation device according to claim 1, wherein the strip-shaped openings correspond to a plurality of center lines of the chambers.

10. The heat dissipation device according to claim 1, wherein a thickness of a portion of each of the strip-shaped plates is different from a thickness of another portion of each of the strip-shaped plates.

* * * * *